United States Patent
Tsuji et al.

(10) Patent No.: US 7,948,313 B2
(45) Date of Patent: May 24, 2011

(54) CLASS D AMPLIFIER CIRCUIT

(75) Inventors: Nobuaki Tsuji, Hamamatsu (JP); Hirotaka Kawai, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 0 days.

(21) Appl. No.: 12/661,723

(22) Filed: Mar. 23, 2010

(65) Prior Publication Data

US 2010/0244958 A1    Sep. 30, 2010

(30) Foreign Application Priority Data

Mar. 25, 2009 (JP) .................................. 2009-074070

(51) Int. Cl.
*H03F 3/217* (2006.01)
(52) U.S. Cl. ........................ 330/251; 330/10; 330/207 A
(58) Field of Classification Search .................... 330/10, 330/251, 207 A
See application file for complete search history.

(56) References Cited

U.S. PATENT DOCUMENTS

| 7,167,046 B2 | 1/2007 | Maejima |
| 7,482,870 B2 * | 1/2009 | Maejima et al. ........... 330/207 P |
| 2007/0146069 A1 * | 6/2007 | Wu et al. ........................ 330/251 |

FOREIGN PATENT DOCUMENTS

JP    2006042296    9/2006

* cited by examiner

*Primary Examiner* — Henry K Choe
(74) *Attorney, Agent, or Firm* — Pillsbury Winthrop Shaw Pittman LLP

(57) ABSTRACT

A class D amplifier circuit includes a signal generation section that generates a first pulse width modulation signal and a second pulse width modulation signal based on an input signal. When a level of the input signal is zero, the signal generation section generates: the first pulse width modulation signal having a repeated first wide-width pulse signal portion, which has a wide width and a repeated first narrow-width pulse signal portion, which has a narrow width which is narrower than the wide width of the first wide-width pulse signal; and the second pulse width modulation signal having a repeated second narrow-width pulse signal portion, which has a narrow width and a repeated second wide-width pulse signal portion, which has a wide width which is wider than the narrow width of the second narrow-width pulse signal portion. A rising point in time of the second narrow-width pulse signal portion occurs after a rising point in time of the first wide-width pulse signal portion and a falling point in time of the second narrow-width pulse signal portion occurs before a falling point in time of the first wide-width pulse signal portion. A rising point in time of the first narrow-width pulse signal portion occurs after a rising point in time of the second wide-width pulse signal portion and a falling point in time of the first narrow-width pulse signal portion occurs before a falling point in time of the second wide-width pulse signal portion.

6 Claims, 6 Drawing Sheets

CLASS D AMPLIFIER CIRCUIT

BACKGROUND

This invention relates to a class D amplifier circuit.

A class D amplifier circuit converts an input signal into a pulse width modulation signal of constant amplitude and amplifies power. For example, the class D amplifier circuit is used for power amplification of an audio signal. The class D amplifier circuit operates in binary and thus can drastically lessen the loss of a transistor. Further, the class D amplifier circuit has the advantage that it has higher efficiency than a linear amplifier regardless of whether the amplitude of an input signal is large or small.

The class D amplifier circuit includes, for example, an integration circuit for integrating input signals, a comparison circuit for making a comparison between an output signal of the integration circuit and a predetermined triangular wave signal, and a pulse width amplifier for outputting a pulse width modulation signal pulse-width-modulated based on the comparison circuit. The output signal of the pulse width amplifier is fed back into the input of the integration circuit. The output signal of the pulse width amplifier passes through a low-pass filter made up of a coil, a capacitor, and the like and becomes an analog signal for driving a load of a loudspeaker, etc.

As the class D amplifier circuits, for example, those as disclosed in Patent Documents 1 and 2 are known.

[Patent Document 1] JP-A-2006-42296

[Patent Document 2] U.S. Pat. No. 7,339,425

By the way, in such a class D amplifier circuit as described above, the low-pass filter becomes a factor of power loss. Also, the existence of the low-pass filter hinders miniaturization, slimming, cost reduction, etc., of the whole device. Hitherto, a class D amplifier circuit attempting to circumvent the loss and upsizing in the filter (refer to Patent Document 1) or a class D amplifier circuit requiring no filter (refer to Patent Document 2) has been provided. However, particularly the latter often involves various defects of occurrence of distortion, etc., and a completely ideal art is not yet provided.

For example, to realize filter-less configuration, a device having a sawtooth waveform with vertical change from a plus peak to a minus peak as the triangular wave signal may be used or operation of appropriately shifting the phase of the pulse width modulation signal as a differential signal or the like may be performed. However, according to the former, there is a fear of occurrence of distortion corresponding to a change portion with infinity of inclination; according to the latter, there is a need for worrying about occurrence of various defects caused by disorder of phase.

SUMMARY

It is an object of the invention to provide a class D amplifier circuit capable of solving at least some of the problems described above and realizing filter-less configuration, etc., preferably.

In order to achieve the above object, according to the present invention, there is provided a class D amplifier circuit comprising:

a signal generation section that generates a first pulse width modulation signal and a second pulse width modulation signal based on an input signal, wherein when a level of the input signal is zero, the signal generation section generates:

the first pulse width modulation signal having a repeated first wide-width pulse signal portion, which has a wide width and a repeated first narrow-width pulse signal portion, which has a narrow width which is narrower than the wide width of the first wide-width pulse signal; and the second pulse width modulation signal having a repeated second narrow-width pulse signal portion, which has a narrow width and a repeated second wide-width pulse signal portion, which has a wide width which is wider than the narrow width of the second narrow-width pulse signal portion;

wherein a rising point in time of the second narrow-width pulse signal portion occurs after a rising point in time of the first wide-width pulse signal portion and a falling point in time of the second narrow-width pulse signal portion occurs before a falling point in time of the first wide-width pulse signal portion; and wherein a rising point in time of the first narrow-width pulse signal portion occurs after a rising point in time of the second wide-width pulse signal portion and a falling point in time of the first narrow-width pulse signal portion occurs before a falling point in time of the second wide-width pulse signal portion.

Preferably, when the level of the input signal is not zero, the first wide-width pulse signal portion and the first narrow-width pulse signal portion become narrower and the second narrow-width pulse signal portion and the second wide-width pulse signal portion become wider; or the first wide-width pulse signal and the first narrow-width pulse signal become wider and the second narrow-width pulse signal portion and the second wide-width pulse signal portion become narrower.

Preferably, the class D amplifier circuit further includes an operational section that integrates a composite signal provided by combining the input signal and a feedback signal and outputs an integration signal, the feedback signal provided by feeding back at least one of the first and second pulse width modulation signals; and a triangular wave generation section that generates a triangular wave signal. The signal generation section generates the first and second pulse width modulation signals based on a comparison result between the integration signal and the triangular wave signal. The triangular wave signal has first and second triangular wave signals corresponding to the first and second pulse width modulation signals and the first and second triangular wave signals differ in form to each other.

Preferably, an occurrence time of a line segment connecting high and low peaks contained in the first triangular wave signal occurs after an occurrence time of a line segment connecting high and low peaks contained in the second triangular wave signal at the 2n'th point in time, wherein n is a natural number. The occurrence time of the line segment connecting the high and low peaks contained in the first triangular wave signal occurs before the occurrence time of the line segment connecting the high and low peaks contained in the second triangular wave signal at the (2n+1'st) point in time.

Preferably, the high and low peaks contained in the first triangular wave signal take repetition of values of A2, B1, A1, B2, A2, B1, A1, B2, . . . in order (where A1>A2>B2>B1). The high and low peaks contained in the second triangular wave signal take repetition of values of A1, B2, A2, 61, A1, B2, A2, 61, . . . in order. The point in time of the peak having the value A2 in the first triangular wave signal is identical with the point in time of the peak having the value A1 in the second triangular wave signal. An occurrence interval of the peaks in the first triangular wave signal is identical with an occurrence interval of the peaks in the second triangular wave signal.

Preferably, a center point of the width of the first wide-width pulse signal is identical with a center point of the width of the second narrow-width pulse signal. A center point of the width of the first narrow-width pulse signal is identical with a center point of the width of the second wide-width pulse signal.

In addition, the advantages provided by various modified embodiment of the invention are made obvious in the description in Specification.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF EXEMPLARY EMBODIMENTS

An embodiment of the invention will be discussed below with reference to FIG. 1: In the accompanying drawings (for example, also containing waveform examples in FIG. 2, etc.,) as well as FIG. 1, the ratio of the dimensions of each part may be made different from the actual ratio where appropriate.

Figure 1:
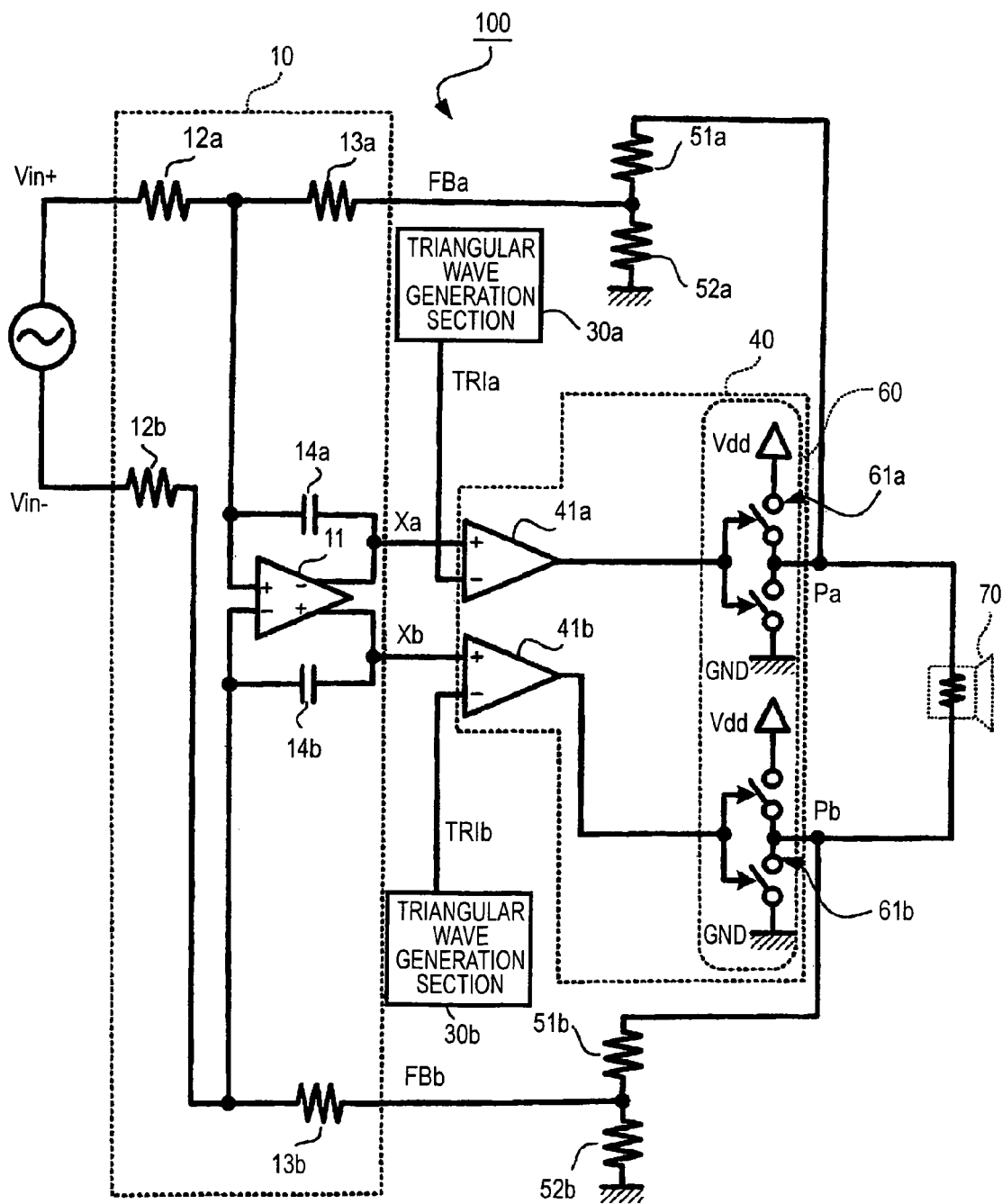
FIG. 1 is a block diagram to show the configuration of a class D amplifier circuit according to an embodiment of the invention.

A class D amplifier circuit 100 includes an operational amplification section 10, a triangular wave generation section 30, and a PWM (Pulse Width Modulation) signal generation section 40, as shown in FIG. 1. In the embodiment, for example, subscripts "a" and "b" are used for symbols (reference numerals) in response to positive and negative like a positive input terminal and a negative input terminal. In the description of the embodiment, however, if it is not necessary to distinguish therebetween, the description of the symbol may be omitted (for example, the "triangular wave generation section 30" is a generic name for triangular wave generation sections 30a and 30b and an "integration signal X" (described later) is a generic name for a plus-side integration signal Xa and a minus-side integration signal Xb or the like).

From a general viewpoint, the class D amplifier circuit 100 includes a positive input terminal and a negative input terminal and a positive output terminal and a negative output terminal. An input signal Vin+ is supplied to the positive input terminal and an input signal Vin− is supplied to the negative input terminal. A first pulse width modulation signal Pa is output from the positive output terminal and a second pulse width modulation signal Pb is output from the negative output terminal. That is, the input signals Vin are given in the format of differential inputs. The first pulse width modulation signal Pa and the second pulse width modulation signal Pb are supplied to a loudspeaker 70.

In the operational amplification section 10, the input signal Vin+ is supplied to a positive input terminal of a fully differential operation amplifier 11 via a resistor 12a and a feedback signal FBa is also supplied to the positive input terminal of the fully differential operation amplifier 11 via a resistor 13a. On the other hand, the input signal Vin− is supplied to a negative input terminal of the fully differential operation amplifier 11 via a resistor 12b and a feedback signal FBb is also supplied to the negative input terminal of the fully differential operation amplifier 11 via a resistor 13b. The resistors 13a and 13b function as input resistors in the operational amplification section 10. The feedback signal FBa of the signals FBa and FBb has a voltage divided by resistors 51a and 52a. Likewise, the feedback signal FBb has a voltage divided by resistors 51b and 52b.

A capacitor 14a is provided between a negative output terminal and the positive input terminal of the fully differential operation amplifier 11 and a capacitor 14b is provided between a positive output terminal and the negative input terminal of the fully differential operation amplifier 11.

Thus, the operational amplification section 10 functions as an integration circuit for combining the input signals Vin+ and Vin− and the feedback signals FBa and FBb respectively and integrating them, and outputs integration signals Xa and Xb.

The triangular wave generation sections 30a and 30b generate triangular wave signals TRIa and TRIb each having a predetermined amplitude and a predetermined phase. The frequency of the triangular wave signal TRI is set higher than the frequencies of the input signals Vin+ and Vin−.

The triangular wave generation sections 30a and 30b generate different triangular waves. The triangular wave generation section 30a generates the triangular wave signal TRIa different in amplitude at the peak time from one point in time to another or with the amplitude adjusted appropriately. The triangular wave generation section 30b also generates the triangular wave signal TRIb similar to the triangular wave signal TRIa. These topics are described later in detail.

The PWM signal generation section 40 generates the pulse-width-modulated first and second pulse width modulation signals Pa and Pb based on the triangular wave signal TRI and the integration signal X.

The PWM signal generation section 40 has a comparator 41 and a full bridge circuit 60. The integration signal X is supplied to a positive input terminal of the comparator 41; on the other hand, the triangular wave signal TRI is supplied to a negative input terminal of the comparator 41. The comparator 41 generates a comparison signal which goes high when the level of the integration signal X exceeds the level of the triangular wave signal TRI and goes low when the level of the integration signal X falls below the level of the triangular wave signal TRI.

On the other hand, the full bridge circuit 60 is made up of two half bridge circuits 61a and 61b corresponding to comparators 41a and 41b respectively. The half bridge circuit 61a has two switches made up of MOSFET (Metal Oxide Semiconductor Field Effect Transistor), etc.; one of the switches has one end set to potential GND and a different end connected to one end of the other switch. A different end of the other switch is set to potential Vdd. The switches are opened/ closed in response to output of the comparator 41*a*. The topic of the half bridge circuit 61*a* also applies to the half bridge circuit 61*b*.

Next, the function, the operation, and the advantages of the class D amplifier circuit 100 according to the embodiment described above will be discussed with reference to FIGS. 2 to 4 in addition to FIG. 1. The embodiment is characterized by the operation in a state that the levels of the input signals Vin+ and Vin− are 0, namely, no sound is produced from the loudspeaker 70 and therefore the description will concentrate on this point.

Figure 2:
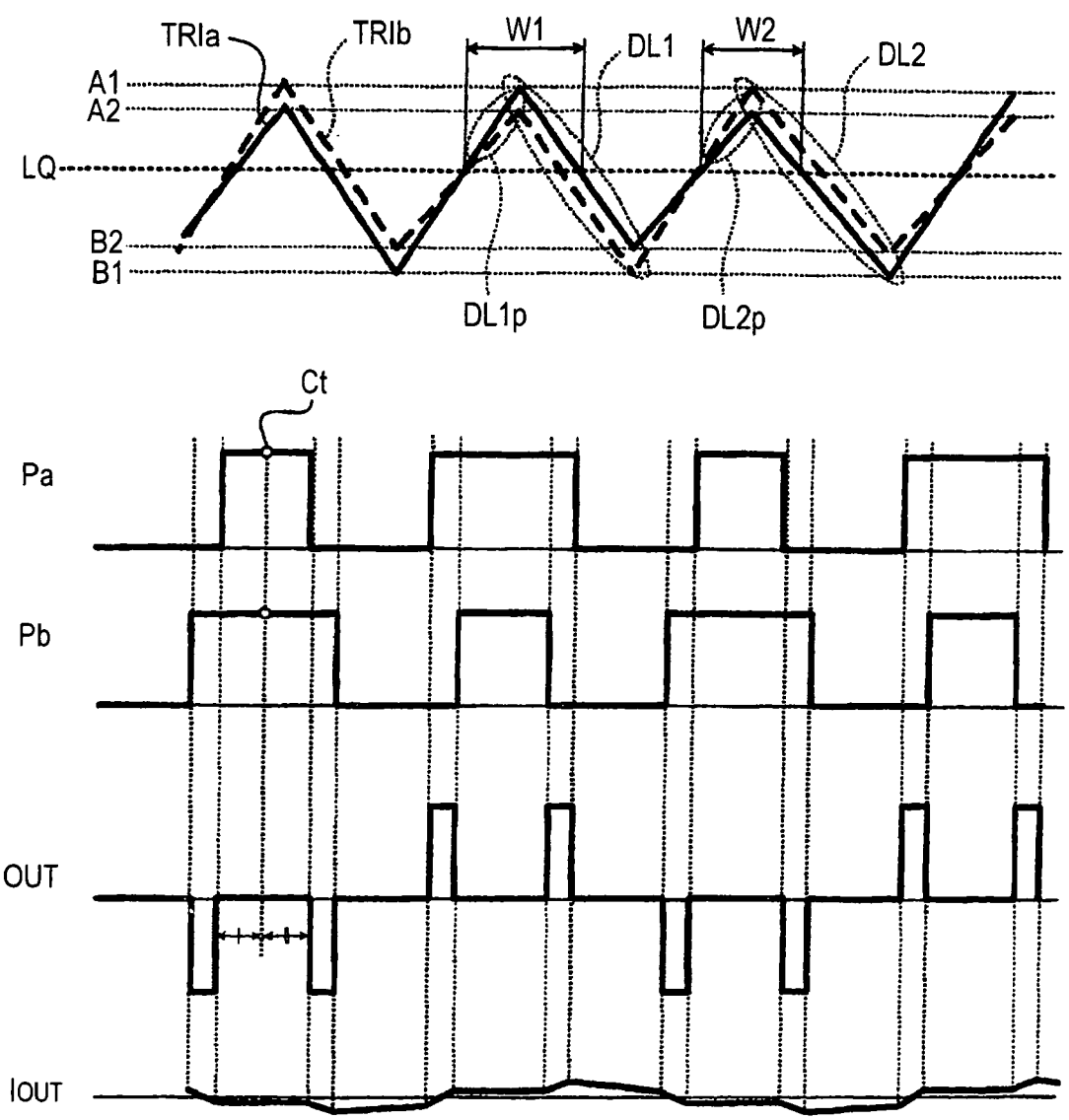
FIG. 2 shows examples of waveforms of triangular wave signals (TRIa and TRIb) generated by a triangular wave generation section, first and second pulse width modulation signals (Pa and Pb) generated by a PWM signal generation section, an output signal (OUT) of a difference signal therebetween, and a current (Iout) flowing into a loudspeaker in FIG. 1 by the output signal.

In the state, the triangular wave generation sections 30*a* and 30*b* generate triangular waves as shown at the top stage of FIG. 2. In the figure, the solid line represents a triangular wave signal generated by the triangular wave generation section 30*a* and the dashed line represents a triangular wave signal generated by the triangular wave generation section 30*b*. As seen in the figure, both the triangular wave signals TRIa and TRIb are different in form to each other. Each of the triangular wave signals TRIa and TRIb differs in amplitude at the peak time from one point in time to another.

That is, the triangular wave signal TRIa takes peak values A2, B1, A1, B2, A2, B1, . . . in order from the left of the figure (in the embodiment, the "peak" contains both the plus-side peak and the minus-side peak). Qualitatively, it can be said that such a triangular wave signal is a signal with a higher peak and a lower peak arranged alternately when attention is focused on either of the plus side and the minus side (in FIG. 2, the peaks are arranged as A2, A1, A2, A1, . . . if attention is focused on the plus side and are arranged as B1, B2, B1, B2, . . . if attention is focused on the minus side) where A1>A2>B2>B1.

Accordingly, it can be considered that the time for which the peak values A2, B1, A1, and B2 make a round is one period of the triangular wave signal TRIa.

The width between sides forming a triangle along a level LQ when unit triangles making up the triangular wave signal TRIa are crossed at the level LQ varies from one unit triangle to another. For example, as shown in FIG. 2, in the unit triangle having the peak value A1, the width when the level LQ crosses the triangle is W1; in the unit triangle having the peak value A2, the width when the level LQ crosses the triangle is W2 where W1>W2 from A1>A2.

The topic basically also applies to the triangular wave signal TRIb. However, the triangular wave signal TRIb takes the peak values A1, B2, A2, B1, A1, B2, . . . in order from the left in FIG. 2.

Both the triangular wave signals TRIa and TRIb differ in form to each other in that they are placed out of phase. That is, as is obvious from the description given above, the triangular wave signal TRIa takes arrangement of the peak values A2, B1, A1, B2, . . . while, the triangular wave signal TRIb takes arrangement of the peak values A1, B2, A2, B1, . . . . Thus, the triangular wave signal TRIa is placed out of phase from the triangular wave signal TRIb as much as a half period (the "period" mentioned here is based on "one period" described above).

However, both the triangular wave signals TRIa and TRIb do not differ from the viewpoint of the peak positions of both the signals. For example, on the leftmost side in FIG. 2, the peak value of the triangular wave signal TRIa is A2 and the peak value of the triangular wave signal TRIb is A1 and thus in this meaning, they differ, but do not differ in the point in time at which the peak appears. The interval between the plus-side peaks (namely, the peaks having the values of A2, A1, A2, A1, . . . ) forming the triangular wave signal TRIa and the interval between the plus-side peaks (namely, the peaks having the values of A1, A2, A1, A2, . . . ) forming the triangular wave signal TRIb are the same. Similarity goes for the interval between the minus-side peaks.

Then, as for both the triangular wave signals TRIa and TRIb, the following can be said: The triangular wave signal TRIa occurs after the triangular wave signal TRIb at one point in time and the triangular wave signal TRIb occurs after the triangular wave signal TRIa at the following point in time (see symbol DL2 in FIG. 2). Later, this is repeated.

In this connection, at the point in time just before symbol DL1 in FIG. 2 (see symbol DL1*p* in FIG. 2), the triangular wave signal TRIa occurs before the triangular wave signal TRIb; at the point in time just before symbol DL2 (see symbol DL2*p* in FIG. 2), the triangular wave signal TRIa occurs after the triangular wave signal TRIb.

In such a case, preferably the point in time at which both the triangular wave signals TRIa and TRIb switch the relationship as described above, namely, the point where the waveforms of both the triangular wave signals TRIa and TRIb cross each other in FIG. 2 exists on the predetermined level LQ (as shown in FIG. 2).

Figure 4:
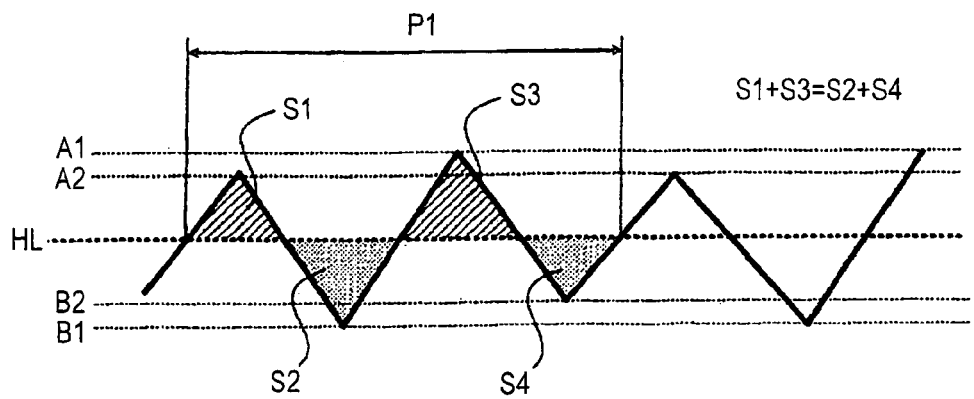
FIG. 4 is a schematic representation to describe preferred conditions for determining the form of the triangular wave signal.

Preferably, such a triangular wave signal TRI may be determined so that S1+S3=S2+S4 is satisfied as for areas S1, S2, S3, S4, . . . of triangles defined as shown in FIG. 4. In FIG. 4, a level HL is given as (A1+B1)/2. The relationship shown in FIG. 4 means that the sum of the areas of the unit triangles projecting upward viewed from the level HL (the sum of S1 and S3 in FIG. 4) equals the sum of the areas of the unit triangles projecting downward (the sum of S2 and S4 in FIG. 4) in the one period (see symbol P1 in FIG. 4).

When the comparators 41*a* and 41*b* and the PWM signal generation section 40 previously described with reference to FIG. 1 operate based on the triangular wave signals TRIa and TRIb having the feature, after all, the first and second pulse width modulation signals Pa and Pb are provided as those having waveforms as shown at the second and third stages of FIG. 2 from the relationship between the triangular wave signals TRIa and TRIb and the integration signals Xa and Xb representing an acoustic signal (also see the description concerning W1, W2, DL1, DL2, etc.,). That is, the first pulse width modulation signal Pa is a signal of an alternating pattern of a pulse of a narrower width and a pulse of a wider width in order from the left of the figure, and the second pulse width modulation signal Pb is a signal of an alternating pattern of a pulse of a wider width and a pulse of a narrower width in order from the left of the figure. In this case, the rising point in time of the pulse signal of the narrower width forming a part of the second pulse width modulation signal Pb occurs after the rising point in time of the pulse signal of the wider width forming a part of the first pulse width modulation signal Pa. The falling point in time of the former occurs before the falling point in time of the latter.

Figure 3:
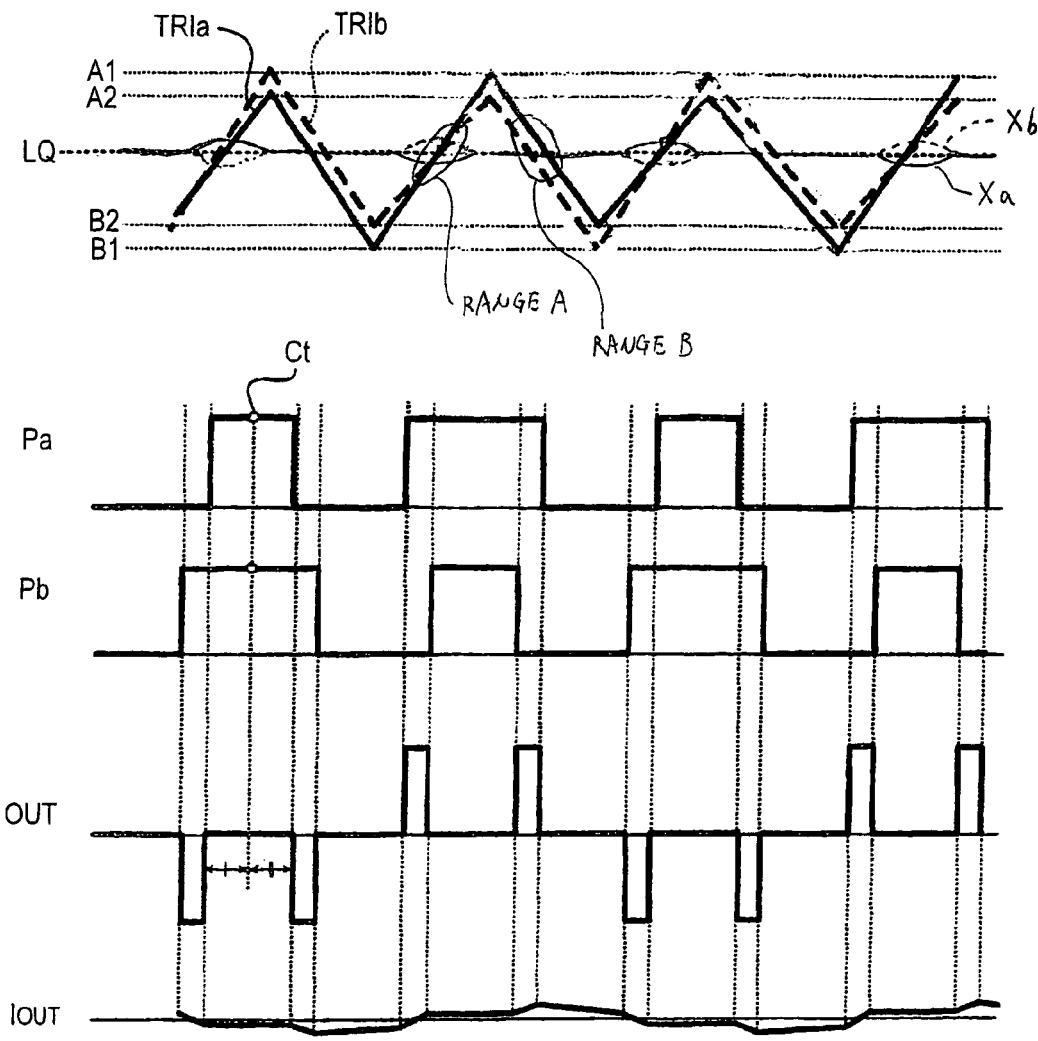
FIG. 3 shows the examples of the waveforms in FIG. 2 in detail.

A relationship among waveforms of signals (TRIa, TRIb, Xa, Xb, Pa, Pb, OUT, Iout) is explained in detail with reference to FIG. 3. In FIG. 3, waveforms of integration signals Xa and Xb are added to the waveforms of the triangular wave signals TRIa and TRIb shown at the upper stage of FIG. 2. Since the other portion of FIG. 3 is similar to that of FIG. 2, a description of similar portions between FIGS. 2 and 3 is omitted herein.

In FIG. 3, the integration signals Xa and Xb shift above and below in amplitude with time in a vicinity of LQ level. Even though the waveforms of the triangular wave signals TRIa and TRIb rising diagonally up to the right (for example, in a vicinity of range A) are closer to each other than that of the triangular wave signals TRIa and TRIb falling diagonally down to the right (for example, in a vicinity of range B), a rising point in time of one of the first and second pulse width modulation signals Pa and Pb is delayed with respect to a rising point in time of the other of the first and second pulse width modulation signals Pa and Pb since amplitude values of the integration signals Xa and Xb in the vicinity of the range A are different to each other. Therefore, a positive pulse signal is output as the output signal (OUT) in the vicinity of the range A.

On the other hand, the waveforms of the triangular wave signals TRIa and TRIb falling diagonally down to the right (for example, in the vicinity of range B) are substantially parallel to each other, that means, the waveforms of the triangular wave signals TRIa and TRIb are shifted in time to each other. A falling point in time of one of the first and second pulse width modulation signals Pa and Pb is delayed with respect to a falling point in time of the other of the first and second pulse width modulation signals Pa and Pb based on a difference between amplitude values of the triangular wave signals TRIa and TRIb in the vicinity of the range B since the amplitude values of the integration signals Xa and Xb in the vicinity of the range B are substantially same to each other. Therefore, a positive pulse signal is output as the output signal (OUT) in the vicinity of the range B.

In this example, the positive pulse signals are output as the output signal (OUT) in the vicinities of the ranges A and B. However, negative pulse signals may be output as the output signal (OUT) based on a condition of phases of the triangular wave signals TRIa and TRIb and phases of the integration signals Xa and Xb.

Finally, an output signal OUT is provided as shown at the fourth stage of FIG. 2 according to the difference between the first and second pulse width modulation signals Pa and Pb. That is, the output signal OUT has a pulse projecting to the minus side if the pulse width of the second pulse width modulation signal Pb on the minus side is wider than the pulse width of the first pulse width modulation signal Pa on the plus side; in the opposite case, the output signal OUT has a pulse projecting to the plus side.

From the relationship between the triangular wave signals TRIa and TRIb (particularly, the relationship that the peak positions match between both the signals), for example, the center of one pulse width in the second pulse width modulation signal Pb and the center of one pulse width corresponding thereto in the first pulse width modulation signal Pa match (see symbol Ct in FIG. 2).

From this and the conditions concerning the rising point in time and the falling point in time, the "pulse projecting to the minus side" described above in the output signal OUT is made up of two pulses equally spaced from each other with the center Ct as the center, as shown in FIG. 2, and the "pulse projecting to the plus side" is made up of two pulses equally spaced from each other. After all, the output signal OUT becomes a signal of an alternating pattern of two minus pulses and two plus pulses. The widths and the heights (applied voltages) of these pulses are all the same.

Figure 5:
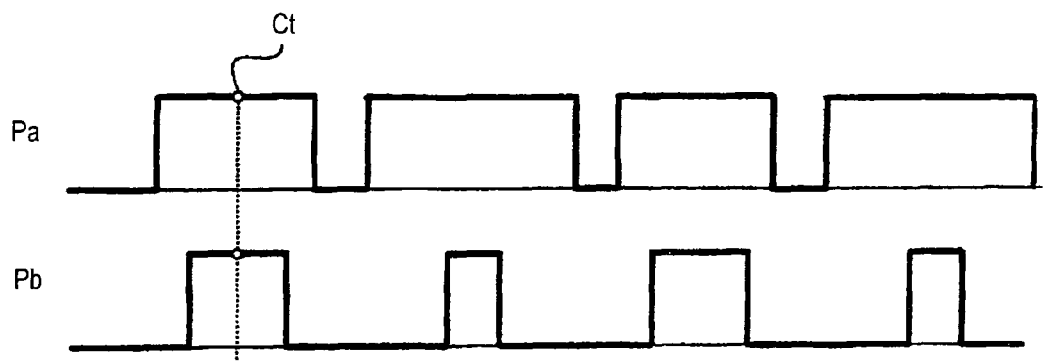
FIG. 5 shows examples of waveforms of the first and second pulse width modulation signals when an input signal is not 0 based on the first and second pulse width modulation signals in FIG. 2.
Figure 5:
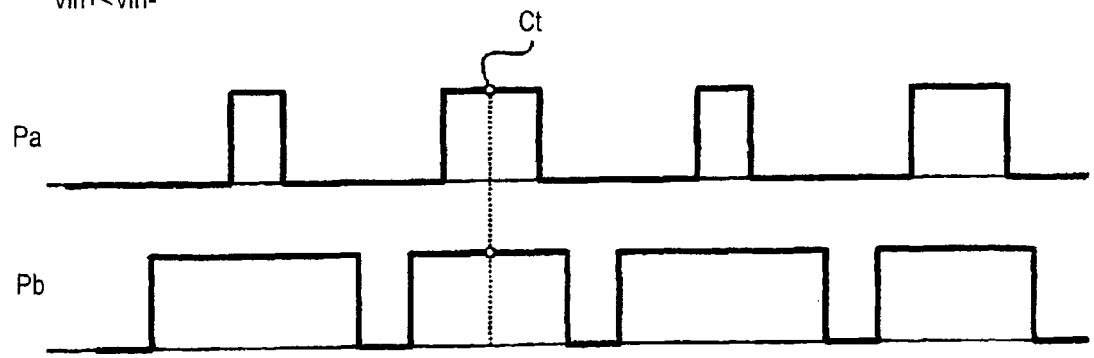

The operation when the input signals Vin+ and Vin− are 0 has been described. When the input signals Vin+ and Vin− are not 0, the first and second pulse width modulation signals Pa and Pb become as shown in FIG. 5, for example. The upper stage of FIG. 5 shows an example wherein the input signal Vin+ on the plus side is positive and the lower stage of FIG. 5 shows an example wherein the input signal Vin− on the minus side is positive. In the former (Vin+>Vin−), the pulse width of the first pulse width modulation signal Pa becomes larger than the pulse width at the second stage of FIG. 2, and the pulse width of the second pulse width modulation signal Pb becomes smaller than the pulse width at the third stage of FIG. 2. In the latter (Vin+<Vin−), the pulse width of the first pulse width modulation signal Pa becomes smaller than the pulse width at the second stage of FIG. 2, and the pulse width of the second pulse width modulation signal Pb becomes larger than the pulse width at the third stage of FIG. 2. In either case, the center Ct does not shift between the first and second pulse width modulation signals Pa and Pb. This means that both the signals (Pa and Pb) are not out of phase.

The class D amplifier circuit 100 having the configuration and the function as described above provides the following advantages:

The class D amplifier circuit 100 of the embodiment provides the output signal OUT as described above, whereby a current Iout as shown at the bottom stage of FIG. 2 flows into the loudspeaker 70. Since the current Iout becomes 0 on time average, no sound is produced from the loudspeaker 70. This is realized without the need for a low-pass filter for the first and second pulse width modulation signals Pa and Pb (see FIG. 1) as seen from the description given above.

Thus, according to the embodiment, a filter need not be installed and miniaturization, slimming, etc., can be realized accordingly. For the same reason, in the embodiment, there is no need for worrying about occurrence of distortion deriving from a low-pass filter or the like.

In this connection, in the embodiment, to provide the output signal OUT as shown at the fourth stage of FIG. 2, for example, a triangular wave signal having a sawtooth waveform with vertical change from a plus peak to a minus peak is not used or operation of appropriately shifting the phases of the first and second pulse width modulation signals Pa and Pb or the like is not performed. According to the former, there is a fear of occurrence of distortion corresponding to a change portion with infinity of inclination; according to the latter, there is a need for worrying about occurrence of various defects caused by disorder of phase.

In this point, in the embodiment, as shown in FIG. 2, the triangular wave signal TRI does not have a special form and the signals described above basically have the same period (containing the acoustic time; see FIG. 5). Therefore, according to the embodiment, the possibility that the disadvantages described above will occur is extremely low.

While the embodiment according to the invention has been described, it is to be understood that the class D amplifier circuit 100 according to the invention is not limited to the specific embodiment described above and can be embodied in various modifications.

(1) The embodiment has been described assuming that the triangular wave signals TRIa and TRIb take the form as shown in FIG. 2, but the invention is not limited to the mode. The triangular wave signal can take any form other than the form shown in FIG. 2 depending on the case in various viewpoints of the peak values, the phases, etc.

(2) The class D amplifier circuit 100 of the embodiment described above generates the first and second pulse width modulation signals Pa and Pb using the triangular wave signal TRI, but the invention is not limited to the embodiment.

Figure 6:
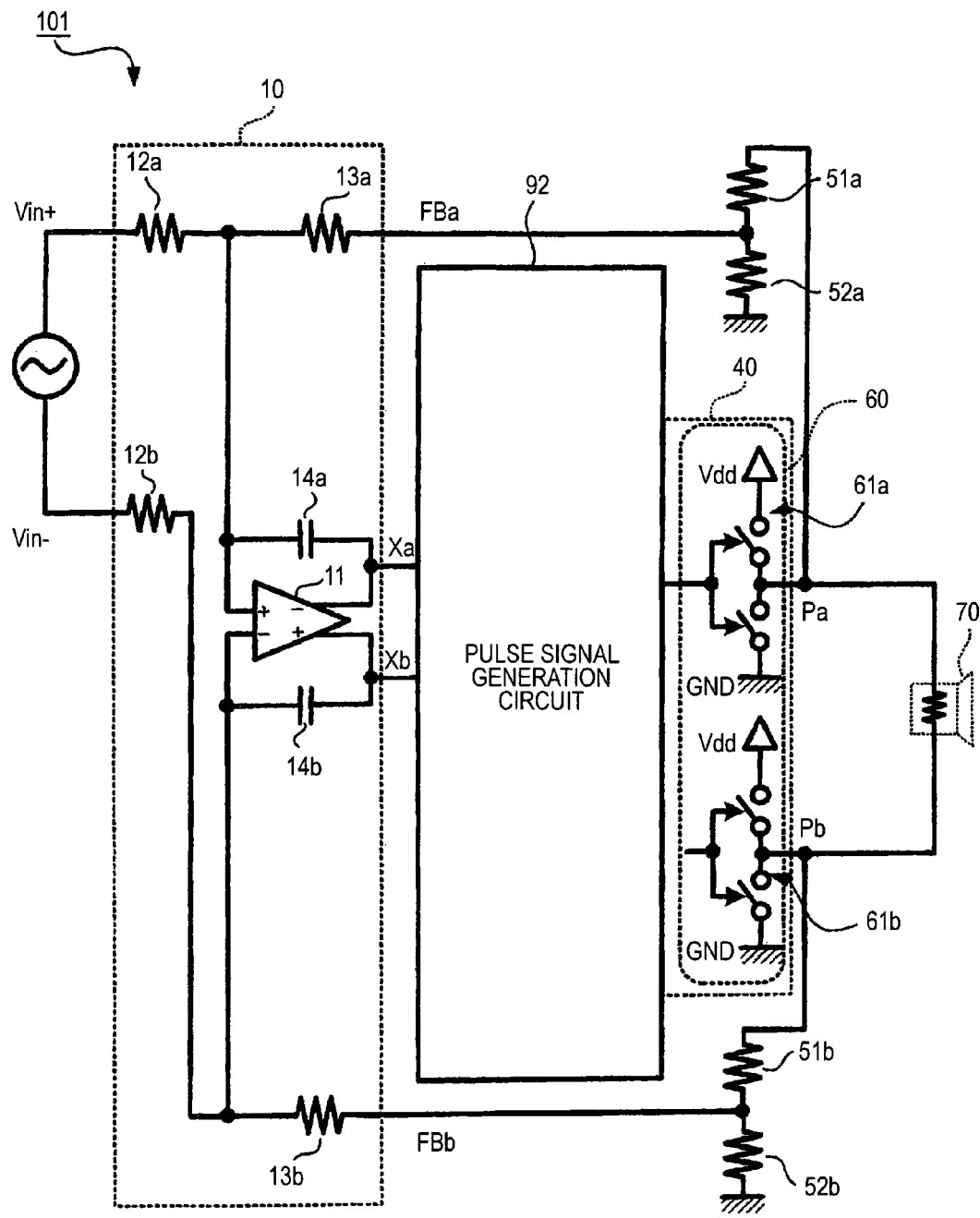
FIG. 6 is a block diagram to show the configuration of a class D amplifier circuit according to another embodiment of the invention.

For example, the class D amplifier circuit according to the invention can also adopt the form as shown in FIG. 6. In FIG. 6, a class D amplifier circuit 101 includes a pulse signal generation circuit 92.

As is obvious from the comparison with FIG. 1, the class D amplifier circuit 101 does not include the triangular wave generation section 30 or the comparator 41 included by the class D amplifier circuit 100. The pulse signal generation circuit 92 replaces the triangular wave generation section 30, etc.

Figure 7:
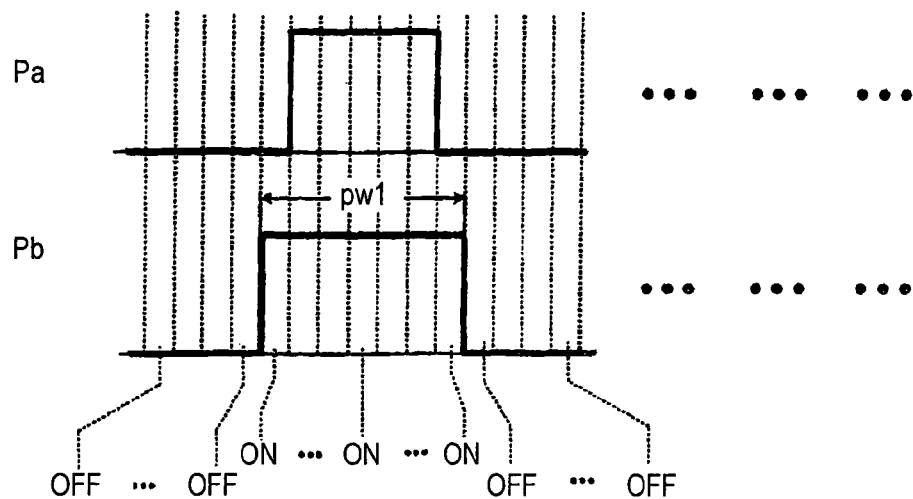
FIG. 7 shows examples of waveforms of pulse signals generated by a pulse signal generation circuit in FIG. 6.
Figure 7:
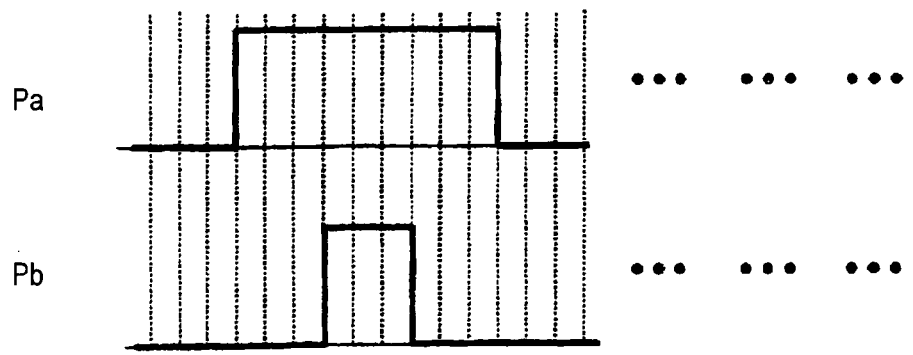
Figure 7:
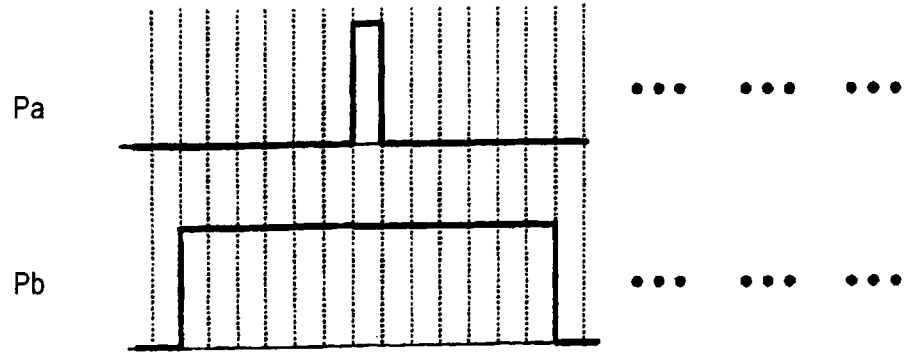

More specifically, the pulse signal generation circuit 92 generates a pulse signal whose output pulse width is changed in stages in response to the integration signals Xa and Xb. For example, FIG. 7 shows how the pulse signals are generated. FIG. 7 shows the case where both the input signals Vin+ and Vin− are 0 (namely, when no sound or no signal exists) at the top stage, the case where input signal Vin+>Vin− at the middle stage, and the case where input signal Vin+<Vin− at the bottom stage. In the figure, for example, the second pulse width modulation signal Pb at the top stage is a pulse signal of OFF, . . . , OFF, ON, . . . , ON, OFF, . . . , OFF and thus is a pulse signal having a pulse width pw1.

The relationship between the waveforms shown at the middle stage and the bottom stage of FIG. 7 and the waveform shown at the top stage of FIG. 7 is basically the same as the relationship between FIG. 5 and (the second stage and the third stage) of FIG. 2.

The pulse signal as shown in FIG. 7 may be simply generated by using a data table storing the ON/OFF arrangement state corresponding to the state of the integration signals Xa and Xb or the like. Of course, any other technique may be adopted.

According to the above configuration, it is also obvious that the advantages not substantially different from those provided by the embodiment described above are provided.

As is obvious from the presentation of the above configuration, the invention need not necessarily use the triangular wave generation section 30, etc., to generate the first and second pulse width modulation signals Pa and Pb as shown at the second stage and the third stage of FIG. 2 (or FIG. 5). In short, when no sound exists, if the first pulse width modulation signal Pa is a pulse signal of repetition of wide, narrow, wide, narrow, . . . , and the second pulse width modulation signal Pb is a pulse signal of repetition of narrow, wide, narrow, wide, . . . , and consequently an output signal made up of each two plus pulses and two minus pulses as shown at the fourth stage of FIG. 2 is provided, it is in the scope of the invention.

Here, the details of the above embodiments are summarized as follows.

A class D amplifier circuit according to the invention includes a signal generation section for generating a pulse width modulation signal based on an input signal. As the pulse width modulation signal, the signal generation section generates, when the level of the input signal is zero, a first pulse width modulation signal with repetition of a first wide-width pulse signal having a wide width and a first narrow-width pulse signal having a narrow width as compared with the first wide-width pulse signal and a second pulse width modulation signal with repetition of a second narrow-width pulse signal having a narrow width and a second wide-width pulse signal having a wide width as compared with the second narrow-width pulse signal at the same time. A rising point in time of the second narrow-width pulse signal in the second pulse width modulation signal occurs after a rising point in time of the first wide-width pulse signal in the first pulse width modulation signal and a falling point in time of the second narrow-width pulse signal occurs before a falling point in time of the first wide-width pulse signal and the rising point in time of the first narrow-width pulse signal in the first pulse width modulation signal occurs after the rising point in time of the second wide-width pulse signal in the second pulse width modulation signal and the falling point in time of the first narrow-width pulse signal occurs before the falling point in time of the second wide-width pulse signal.

According to the invention, the first pulse width modulation signal is a signal of a string of pulses having wide, narrow, wide, narrow, . . . widths, while, the second pulse width modulation signal is a signal of a string of pulses having narrow, wide, narrow, wide, . . . widths. In this case, the rising point in time and the falling point in time of the second (or first) narrow-width pulse signal in the second (or first) pulse width modulation signal have the relationship as described above with those of the first (or second) wide-width pulse signal in the first (or second) pulse width modulation signal and thus the relationship between the second (or first) narrow-width pulse signal and the first (or second) wide-width pulse signal as if the second (or first) narrow-width pulse signal were fallen within the first (or second) wide-width pulse signal holds. Therefore, if the difference is taken between the first and second pulse width modulation signals, the substance of the wide-width pulse signal is taken away by the narrow-width pulse signal and only both end portions of the wide-width pulse signal remain. Consequently, after all, two pulses are obtained. Considering that one of the first and second pulse width modulation signals can have a plus polarity and the other can have a minus polarity, after all, the signal resulting from the difference becomes a signal of an alternating pattern of two pulses projecting to the plus side and two pulses projecting to the minus side.

Such a signal is produced at least when the level of the input signal is 0, namely, when no sound exists or no signal exists. Since the time-varying current average value relating to the signal is 0 and thus, for example, if the signal is supplied to a loudspeaker, etc., as a load, the possibility that useless noise, distortion, etc., may occur scarcely exists.

The invention makes it possible to enjoy the advantage without providing a filter, etc., for the first or second pulse width modulation signal. In the invention, there is no or almost no fear of defects as described above.

Preferably, when the level of the input signal is not zero, the width of the second narrow-width pulse signal may become narrower and the width of the first wide-width pulse signal may become wider.

According to the above configuration, for example, if the class D amplifier circuit according to the invention is connected to a loudspeaker, etc., as a load, it is made possible to reproduce a sound signal appropriately.

In this case, in the first (or second) narrow-width pulse signal in the first (or second) pulse width modulation signal and the second (or first) wide-width pulse signal in the second (or first) pulse width modulation signal corresponding thereto, preferably the center point of the width of the former (namely, the point in time) and the center point of the width of the latter (namely, the point in time) match. In so doing, the first and second pulse width modulation signals are not placed out of phase.

Preferably, the class D amplifier circuit further includes an operational section for integrating a composite signal provided by combining the input signal and a feedback signal and outputting an integration signal; and a triangular wave generation section for generating a triangular wave signal. The composition signal is provided by feeding back at least one of the first and second pulse width modulation signals. The signal generation section may generate the pulse width modulation signal based on the comparison result between the integration signal and the triangular wave signal. The triangular wave signal may contain first and second triangular wave signals corresponding to the first and second pulse width modulation signals and the first and second triangular wave signals may differ in form.

According to this configuration, the first pulse width modulation signal is generated by the first triangular wave signal and the integration signal corresponding to the first pulse width modulation signal (feedback signal), and the second pulse width modulation signal is generated by the second triangular wave signal and the integration signal corresponding to the second pulse width modulation signal (feedback signal). In the form, the first and second triangular wave signals differ in form, so that the first and second pulse width modulation signals like wide, narrow, wide, narrow, . . . or narrow, wide, narrow, wide, . . . described above can be generated appropriately.

In the class D amplifier circuit of the invention, the occurrence time of a line segment connecting high and low peaks contained in the first triangular wave signal may be late for the occurrence time of a line segment connecting high and low peaks contained in the second triangular wave signal at the 2n'th (where n is a natural number) point in time and may lead the occurrence time of a line segment connecting high and low peaks contained in the second triangular wave signal at the (2n+1'st) point in time.

According to this configuration, the first and second pulse width modulation signals like wide, narrow, wide, narrow, . . . or narrow, wide, narrow, wide, . . . described above can be generated more appropriately.

In this configuration, the expression "the time in point" does not refer to only one strict point. Here, "the occurrence time of a line segment" is at stake and thus "the time in point" can take the meaning as the time of a given length (or the time having a given width) as represented by the line segment as the line segment is projected onto the time axis. Based on the premise, "the 2n'th point in time" and "the (2n+1'st) point in time" occur alternately at given intervals. Preferably, the "given intervals" is the interval or spacing between adjacent high peaks (or low peaks) of high and low peaks.

A more specific explanation is mentioned in the description concerning FIG. 2 in the embodiment.

In the class D amplifier circuit of the invention, the high and low peaks contained in the first triangular wave signal may take repetition of values of A2, B1, A1, B2, A2, B1, A1, B2, . . . in order (where A1>A2>B2>B1), the high and low peaks contained in the second triangular wave signal may take repetition of values of A1, B2, A2, B1, A1, B2, A2, B1, . . . in order, the point in time of the peak having the value A2 in the first triangular wave signal may match the point in time of the peak having the value A1 in the second triangular wave signal, and the occurrence interval of the peaks in the first triangular wave signal may match the occurrence interval of the peaks in the second triangular wave signal.

This configuration is one of configurations in which the first and second pulse width modulation signals like wide, narrow, wide, narrow, . . . or narrow, wide, narrow, wide, . . . described above are generated most appropriately. A more specific example is described in the embodiment.

In the definition described above, the first triangular wave signal starts at the peak having the value A2 and the second triangular wave signal starts at the peak having the value A1, but the invention is not limited to this configuration. For example, the first triangular wave signal may start at the peak having A1. In this case, as for the first triangular wave signal, repetition with one set of A1, B2, A2, B1 is made. In short, the arrangements or the orders of A1, A2, B1, B2 defined as for the first and second triangular wave signals are important.

In the embodiment, "match" means not only strict match, but also match containing a measure of slight difference therebetween.

Although the invention has been illustrated and described for the particular preferred embodiments, it is apparent to a person skilled in the art that various changes and modifications can be made on the basis of the teachings of the invention. It is apparent that such changes and modifications are within the spirit, scope, and intention of the invention as defined by the appended claims.

The present application is based on Japanese Patent Application No. 2009-074070 filed on Mar. 25, 2009, the contents of which are incorporated herein for reference.

What is claimed is:

1. A class D amplifier circuit comprising:
a signal generation section that generates a first pulse width modulation signal and a second pulse width modulation signal based on an input signal,
wherein when a level of the input signal is zero, the signal generation section generates:
the first pulse width modulation signal having a repeated first wide-width pulse signal portion, which has a wide width and a repeated first narrow-width pulse signal portion, which has a narrow width which is narrower than the wide width of the first wide-width pulse signal; and
the second pulse width modulation signal having a repeated second narrow-width pulse signal portion, which has a narrow width and a repeated second wide-width pulse signal portion, which has a wide width which is wider than the narrow width of the second narrow-width pulse signal portion;
wherein a rising point in time of the second narrow-width pulse signal portion occurs after a rising point in time of the first wide-width pulse signal portion and a falling point in time of the second narrow-width pulse signal portion occurs before a falling point in time of the first wide-width pulse signal portion; and
wherein a rising point in time of the first narrow-width pulse signal portion occurs after a rising point in time of the second wide-width pulse signal portion and a falling point in time of the first narrow-width pulse signal portion occurs before a falling point in time of the second wide-width pulse signal portion.

2. The class D amplifier circuit according to claim 1, wherein when the level of the input signal is not zero,
the first wide-width pulse signal portion and the first narrow-width pulse signal portion become narrower and the second narrow-width pulse signal portion and the second wide-width pulse signal portion become wider; or
the first wide-width pulse signal and the first narrow-width pulse signal become wider and the second narrow-width pulse signal portion and the second wide-width pulse signal portion become narrower.

3. The class D amplifier circuit according to claim 1, further comprising:
an operational section that integrates a composite signal provided by combining the input signal and a feedback signal and outputs an integration signal, the feedback signal provided by feeding back at least one of the first and second pulse width modulation signals; and
a triangular wave generation section that generates a triangular wave signal,
wherein the signal generation section generates the first and second pulse width modulation signals based on a comparison result between the integration signal and the triangular wave signal; and
wherein the triangular wave signal has first and second triangular wave signals corresponding to the first and second pulse width modulation signals and the first and second triangular wave signals differ in form to each other.

4. The class D amplifier circuit according to claim 3, wherein an occurrence time of a line segment connecting high and low peaks contained in the first triangular wave signal occurs after an occurrence time of a line segment connecting high and low peaks contained in the second triangular wave signal at the 2n'th point in time, wherein n is a natural number; and wherein the occurrence time of the line segment connecting the high and low peaks contained in the first triangular wave signal occurs before the occurrence time of the line segment connecting the high and low peaks contained in the second triangular wave signal at the (2n+1'st) point in time.

5. The class D amplifier circuit according to claim 3, wherein the high and low peaks contained in the first triangular wave signal take repetition of values of A2, B1, A1, B2, A2, B1, A1, B2, ... in order (where A1>A2>B2>B1);

wherein the high and low peaks contained in the second triangular wave signal take repetition of values of A1, B2, A2, B1, A1, B2, A2, B1, ... in order;

wherein the point in time of the peak having the value A2 in the first triangular wave signal is identical with the point in time of the peak having the value A1 in the second triangular wave signal; and wherein an occurrence interval of the peaks in the first triangular wave signal is identical with an occurrence interval of the peaks in the second triangular wave signal.

6. The class D amplifier circuit according to claim 2, wherein a center point of the width of the first wide-width pulse signal is identical with a center point of the width of the second narrow-width pulse signal; and wherein a center point of the width of the first narrow-width pulse signal is identical with a center point of the width of the second wide-width pulse signal.

* * * * *